(12) United States Patent
Lu et al.

(10) Patent No.: US 8,697,549 B2
(45) Date of Patent: Apr. 15, 2014

(54) DEPOSITION OF POROUS FILMS FOR THERMOELECTRIC APPLICATIONS

(75) Inventors: Xianfeng Lu, Beverly, MA (US); Ludovic Godet, Boston, MA (US); Christopher Hatem, Hampton, NH (US); John Hautala, Beverly, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 13/587,325

(22) Filed: Aug. 16, 2012

(65) Prior Publication Data

US 2013/0045557 A1    Feb. 21, 2013

Related U.S. Application Data

(60) Provisional application No. 61/524,560, filed on Aug. 17, 2011.

(51) Int. Cl.
*H01L 21/20* (2006.01)

(52) U.S. Cl.
USPC .............. 438/478; 438/54; 438/119; 438/597

(58) Field of Classification Search
USPC ................................................... 257/478, 54
See application file for complete search history.

(56) References Cited

U.S. PATENT DOCUMENTS

| 2010/0024437 A1 | 2/2010 | Elsner et al. | |
| 2010/0242265 A1* | 9/2010 | Wadley et al. | 29/623.5 |
| 2011/0139207 A1* | 6/2011 | Edwards | 136/230 |

FOREIGN PATENT DOCUMENTS

| EP | 0455051 A2 | 11/1991 |
| WO | 2010/003629 A2 | 1/2010 |

* cited by examiner

*Primary Examiner* — Mamadou Diallo

(57) ABSTRACT

An improved method of creating thermoelectric materials which have high electrical conductivity and low thermal conductivity is disclosed. In one embodiment, the thermoelectric material is made by depositing a porous film onto a substrate, introducing a dopant into the porous film and annealing the porous film to activate the dopant. In other embodiments, additional amounts of dopant may be introduced via subsequent ion implantations of dopant into the deposited porous film.

18 Claims, 8 Drawing Sheets

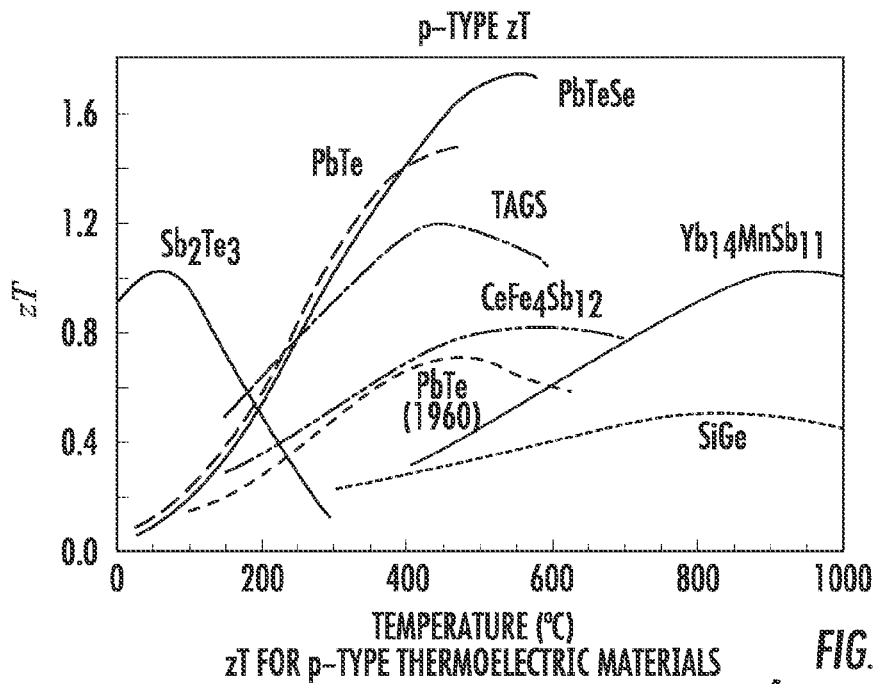
FIG. 2 (PRIOR ART) zT for p-TYPE THERMOELECTRIC MATERIALS
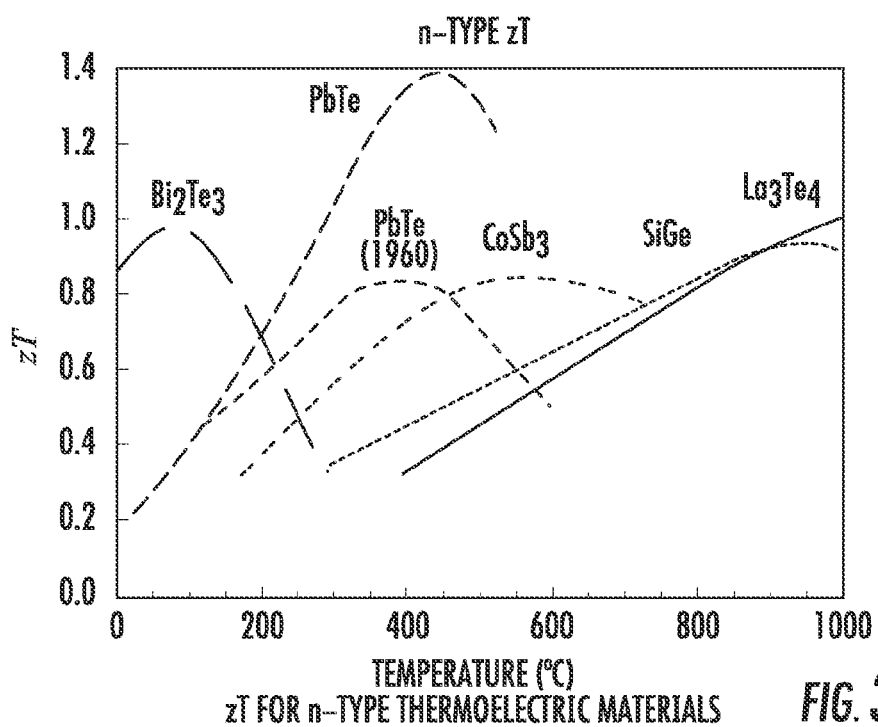
FIG. 3 (PRIOR ART) zT for n-TYPE THERMOELECTRIC MATERIALS

DEPOSITION OF POROUS FILMS FOR THERMOELECTRIC APPLICATIONS

This application claims priority to U.S. Provisional Patent Application Ser. No. 61/524,560, filed Aug. 17, 2011, the disclosure of which is incorporated herein by reference in its entirety.

FIELD

This invention relates to deposition of porous films and, more particularly, to deposition of porous films for thermoelectric applications.

BACKGROUND

Thermoelectric devices are used to convert temperature differences to electric voltage. These thermoelectric devices can be used in sensors, for recycling waste heat, for increasing auto fuel efficiency, for solar energy conversion, or in other devices. For example, current solar cells do not convert low frequency heat energy. A combined solar and thermoelectric system will convert more solar radiation into electricity and increase efficiency of the solar cell. Of course, other devices also can benefit from thermoelectric energy conversion.

FIG. 1 is a view of an embodiment of a thermoelectric device. If a temperature gradient is formed in a thermoelectric material, an electric potential or voltage will be produced by this temperature difference due to the Seebeck effect. If the hot ends of the n-type and p-type materials are electrically connected and a load is connected across the cold ends of the n-type and p-type materials, then the voltage produced by the Seebeck effect will cause current to flow through the load. This will generate electrical power.

Thermoelectric conversion efficiency is determined by a material property known as the thermoelectric Figure of Merit (zT). zT is defined as:

$$zT = (\alpha S^2 T)/\kappa$$

wherein $\alpha$ is electrical conductivity, $\kappa$ is thermal conductivity, S is the Seebeck coefficient, and T is temperature. Increasing $\alpha$ while decreasing $\kappa$ is needed to improve zT. Currently, the best zT for a material is approximately 1.6. FIGS. 2-3 illustrate zT for several known p-type and n-type thermoelectric materials. The low zT value of current materials limits new thermoelectric applications that may require a higher zT value. What is needed is an improved thermoelectric material or, more particularly, a porous film for thermoelectric applications.

SUMMARY

An improved method of creating thermoelectric materials which have high electrical conductivity and low thermal conductivity is disclosed. In one embodiment, the thermoelectric material is made by depositing a porous film onto a substrate, introducing a dopant into the porous film and annealing the porous film to activate the dopant. In other embodiments, additional amounts of dopant may be introduced via subsequent ion implantations of dopant into the deposited porous film.

BRIEF DESCRIPTION OF THE DRAWINGS

For a better understanding of the present disclosure, reference is made to the accompanying drawings, which are incorporated herein by reference and in which:

FIG. 2 is a chart illustrating zT versus temperature for p-type thermoelectric materials;

FIG. 3 is a chart illustrating zT versus temperature for n-type thermoelectric materials;

DETAILED DESCRIPTION

The embodiments are described herein in connection with an ion implanter. However, other systems and processes involved in semiconductor manufacturing or other systems that use a plasma may be used. Thus, the invention is not limited to the specific embodiments described below.

Figure 1:
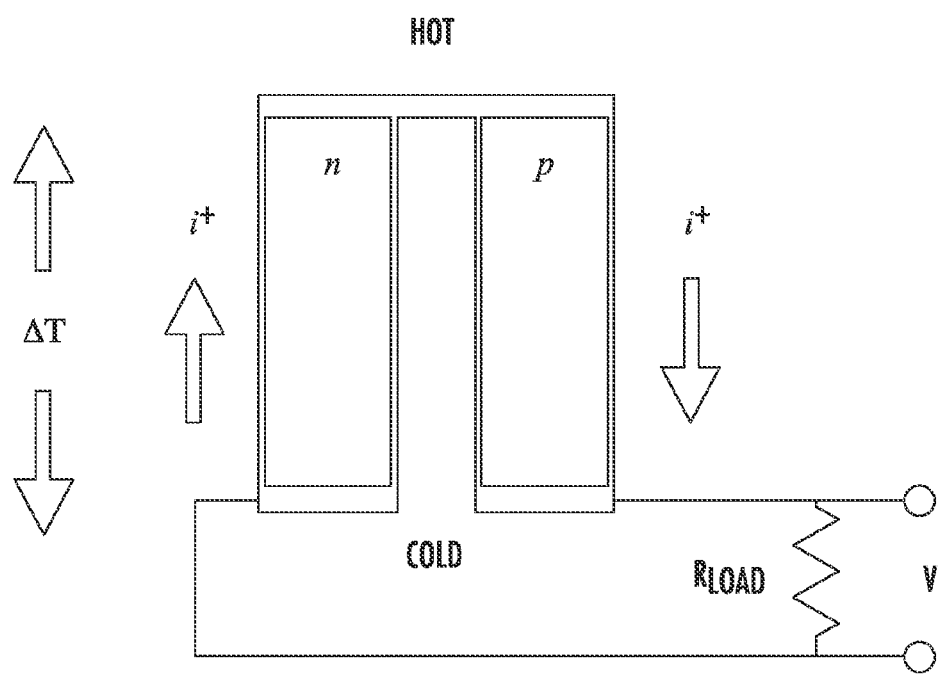
FIG. 1 is a view of an embodiment of a thermoelectric device.
Figure 4A:
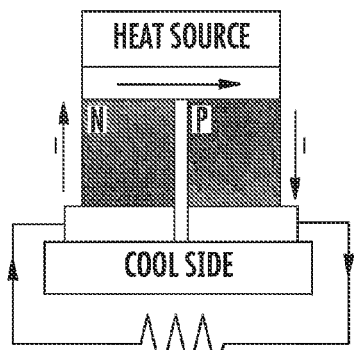
FIGS. 4A-B are two embodiments of a thermoelectric device using porous thin films.
Figure 4B:
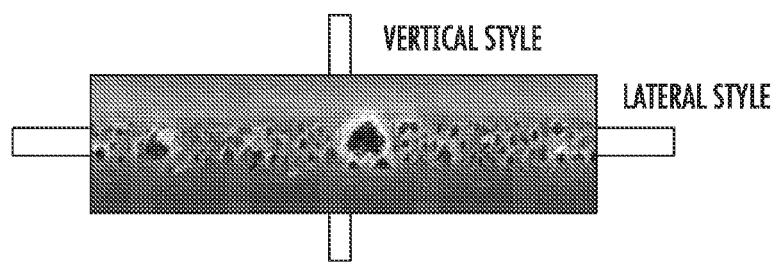

To maximize zT, it may be necessary to reduce the thermal conductivity ($\kappa$) while increasing electrical conductivity ($\alpha$). To do so, several different factors must be considered. The thermal conductivity of the desired material may be reduced. This may be achieved through use of a porous film material. A porous film material will improve a zT value. FIG. 4A shows the overall configuration of a thermoelectric device, where one end of the n-type and p-type materials are in contact with a heat source and the opposite ends provide a voltage difference which may be used to drive a load. FIG. 4B shows two possible embodiments of a thermoelectric device using porous thin films. FIG. 4B illustrates a vertical style thermoelectric device and a lateral style thermoelectric device. For thin film devices, the orientation is either along the thin film (lateral) or vertically through the thin film (vertical). The device thickness and heat transport areas vary between the lateral and vertical orientations.

There is a difference in $\kappa$ between low-doped Si and high-doped Si. This difference may in one instance be as much as 105 W/mK. However, this $\kappa$ is still high compared to that of conventional thermoelectric materials such as PbTe. A porous structure reduces $\kappa$ of the material due to increased phonon scattering, thus improving the zT value for the material. The wall in a porous network will significantly enhance the phonon scattering compared to a non-porous network. Thus, if Si is made porous, the $\kappa$ is reduced compared to crystalline Si. The lowest $\kappa$ achieved in testing on porous Si was 17 W/mK, which is about half the $\kappa$ of Pb. Due to financial and environmental concerns, porous Si may be a better choice than Pb for thermoelectric devices. Other materials besides Si that potentially can used in thermoelectric devices also may benefit from changing porosity, such as Ge, C, SiC, SiGe, or other materials.

An ion-assisted deposition technique can be used to deposit a porous thin film. Deposition can be performed in a number of ways.

In one embodiment, a plasma processing apparatus is used. In operation, a primary gas containing a desired dopant is introduced into a chamber of the plasma processing apparatus. The apparatus is configured to generate the plasma within the process chamber. To generate the plasma, the RF source resonates RF currents in at least one of the RF antennas to produce an oscillating magnetic field. The RF currents in the process chamber excite and ionize the primary dopant gas to generate the plasma.

A bias power supply provides a platen signal to bias the platen and hence the workpiece to accelerate ions from the plasma towards the workpiece. The ions may be positively charged ions and hence the ON periods of the platen signal may be negative voltage pulses with respect to the process chamber to attract the positively charged ions. The amplitude of the platen signal may be selected to provide a desired energy.

To create porous material via deposition, a reaction gas, such as hydride based feedstock, including $CH_4$, $SiH_4$, di-silane or $GeH_4$, is introduced into the plasma processing chamber. In some embodiments, a fluorine based feedstock, such as $SiF_4$ or $CF_4$ also may be used as a reaction gas. The pressure within the chamber is preferably maintained at very low pressure, such as between 1 mTorr and 20 mTorr. In some embodiments, a pressure of about 5 mTorr is used. Porous silicon may be best fabricated by increasing the ionization rate of the reaction gas in the plasma. In one embodiment, the reaction gas is diluted with molecular hydrogen, such that the concentration of the reaction gas is less than, for example, 5%. In some embodiments, RF power of between about 1 kW and 5 kW is used to ionize the reaction gas. While highly diluted reaction gas is used in some embodiments, in other embodiments, concentrations of reaction gas up to about 80% may be mixed with a noble gas, such as helium, neon, argon, krypton, or xenon, or hydrogen. In some embodiments, the diluent gas may contain a species that is intended to be deposited as well. For example, a diluent gas such as $N_2$ or $NH_3$ may be used in conjunction with $SiH_4$ to deposit both silicon and nitrogen. Other diluent gasses include $CH_4$, other alkanes, or other hydrocarbons, which would allow the deposition of carbon. Of course, in some embodiments, two different reaction gasses are used to produce ions of two different species. These two reaction gasses may be diluted with a noble gas or hydrogen, as described above.

A factor in the growth of porous materials, such as porous silicon, is the bias voltage applied by the bias power supply. For example, a strong bias voltage may cause the ions to accelerate too quickly toward the workpiece, thereby damaging the workpiece surface. Thus, an external bias voltage may be applied to enhance deposition, but this bias voltage may be controlled so it does not damage the workpiece surface. As the thickness of the deposited layer increases, the bias voltage may be ramped up to increase the deposition rate while avoiding most damage to the workpiece.

In one embodiment, the bias voltage at the beginning of the deposition may be low, such as about 500V. As the deposition thickness increases, the bias voltage can be ramped up to increase the deposition speed. In this way, damage to the workpiece can be minimized because the initial deposition will shield or mask the surface of the workpiece. For example, in one embodiment, the bias voltage is maintained at 500V for one minute and then ramped to about 3KV or higher for the remainder of the deposition process. This reduces processing time.

In addition to fabricating porous materials, such as silicon, through ion-assisted deposition, various characteristics of the porous material can be controlled and varied. For example, two important characteristics of porous silicon are porosity and pore size. These parameters are advantageously controlled by modification of certain operating conditions within the plasma processing chamber. For example, pore size and porosity may be modified by adjusting the ratio of ions to neutral species in the plasma. For example, greater porosity and pore size may be achieved by changing this ratio. This ratio can be affected by varying the reaction gas (e.g., $SiH_4$) flux, concentration and RF power. For example, a 15% mixture of $SiH_4$ at 5 mTorr allowed the fabrication of a porous silicon structure with high porosity and a pore size less than 20 nm. The remainder of the mixture may be, for example, hydrogen, helium or neon. In other embodiments, the concentration of reaction gas, such as $SiH_4$, is varied, such as from 5-50%, to modify the pore size and porosity. Of course, other ratios or concentrations are possible.

For example, in one embodiment, to form a porous silicon film, $SiH_4$ and $H_2$ may be used as gas sources. In one possible mechanism for forming the porous film, the $H_x^+$ (where x is between 1 and 3) ions form $H_2$ bubbles or pockets in the Si and create a porous structure. Of course, other mechanisms are possible for forming the porous film.

In another embodiment, the ionization rate using $SiH_4$ and $H_2$ may be increased by diluting the $SiH_4$ in $H_2$ to obtain a $SiH_4$ concentration of less than approximately 5%. Under the same plasma power, more $SiH_4$ molecules will be ionized with a decrease of $SiH_4$ partial pressure inside the chamber where the plasma is generated. During the ion-assisted deposition the process pressure may be as low as approximately 5 mTorr.

In some embodiments, larger pore size and porosity can be achieved by increasing RF power, decreasing reaction gas concentration, or lowering pressure. In some embodiments, the ion angular distribution is used to control the pore distribution and the pore size. For example, normal incidence ions are difficult to use in order to create porous silicon, while a wide range of incident angles or a focused ion beam, both of which may be created using sheath engineering, may allow creation of porous silicon. Plasma sheath modification may be used to change the incident angle of the ions and therefore, the pore size and porosity.

Figure 6:
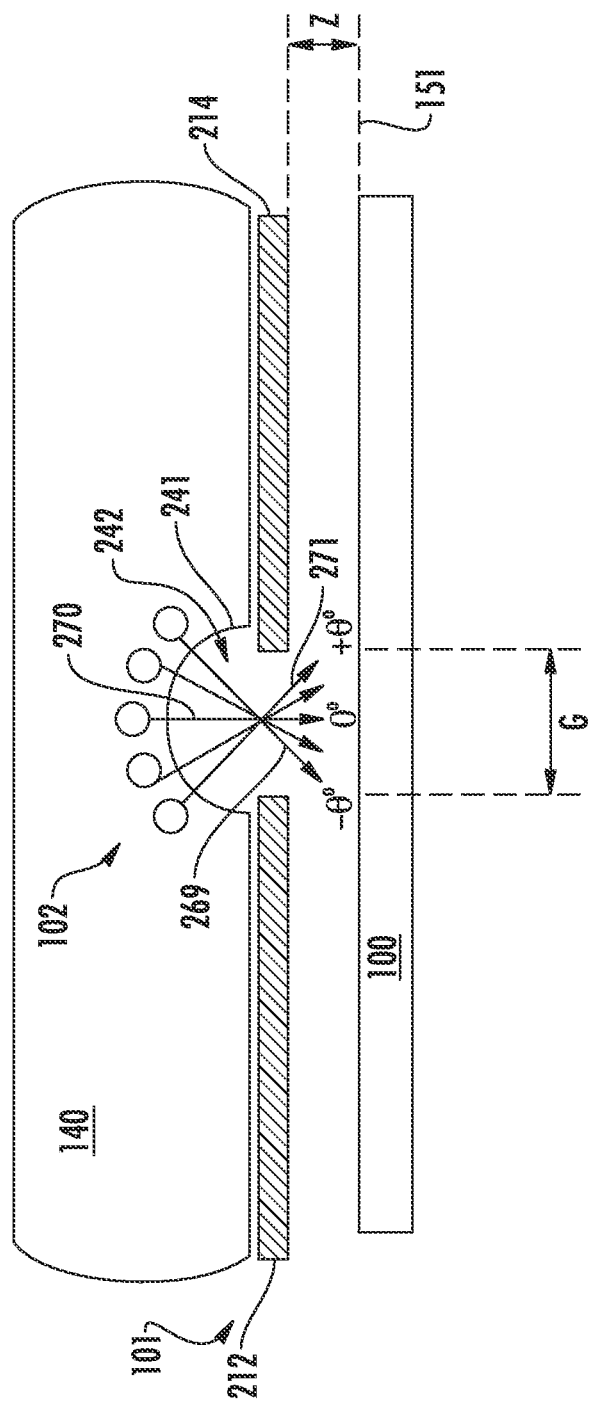
FIG. 6 is a block diagram of a plasma processing apparatus having a plasma sheath modifier.

FIG. 6 is a block diagram of a plasma processing apparatus having a plasma sheath modifier. The embodiment of FIG. 6 may be used with a plasma doping system or with another plasma generation system. In the embodiment of FIG. 6, the plasma sheath modifier 101 includes a pair of panels 212 and 214 defining an aperture there between having a horizontal spacing (G). The panels 212 and 214 may be an insulator, semiconductor, or conductor. In other embodiments, the plasma sheath modifier 101 may include only one panel or more than two panels. The panels 212 and 214 may be a pair of sheets having a thin, flat shape. In other embodiments, the panels 212 and 214 may be other shapes such as tube-shaped, wedge-shaped, and/or have a beveled edge proximate the aperture. The panels 212 and 214 also may be positioned a vertical spacing (Z) above the plane 151 defined by the front surface of the workpiece 100. In one embodiment, the vertical spacing (Z) may be about 1.0 to 10.0 mm.

Ions 102 may be attracted from the plasma 140 across the plasma sheath 242 by different mechanisms. In one instance, the workpiece 100 is biased to attract ions 102 from the plasma 140 across the plasma sheath 242. In another instance, a plasma source that generates the plasma 140 and walls surrounding the plasma 140 are biased positively and the workpiece 100 may be grounded. The biasing may be pulsed in one particular embodiment. In yet another instance, electric or magnetic fields are used to attract ions 102 from the plasma 140 toward the workpiece 100.

Advantageously, the plasma sheath modifier 101 modifies the electric field within the plasma sheath 242 to control a shape of the boundary 241 between the plasma 140 and the plasma sheath 242. The boundary 241 between the plasma 140 and the plasma sheath 242 may have a convex shape relative to the plane 151 in one instance. When the workpiece 100 is biased, for example, the ions 102 are attracted across the plasma sheath 242 through the aperture between the panels 212 and 214 at a large range of incident angles. For instance, ions 102 following trajectory path 271 may strike the workpiece 100 at an angle of +θ° relative to the plane 151. Ions 102 following trajectory path 270 may strike the workpiece 100 at about an angle of 0° relative to the same plane 151. Ions 102 following trajectory path 269 may strike the workpiece 100 an angle of −θ° relative to the plane 151. Accordingly, the range of incident angles may be between +θ° and −θ° centered about 0°. In addition, some ion trajectories paths such as paths 269 and 271 may cross each other. Depending on a number of factors including, but not limited to, the horizontal spacing (G) between the panels 212 and 214, the vertical spacing (Z) of the panels 212 and 214 above the plane 151, the dielectric constant of the panels 212 and 214, or other process parameters of the plasma 140, the range of incident angles (θ) may be between +60° and −60° centered about 0°.

The embodiment of FIG. 6 may be used for either deposition or doping depending on the bias parameters, plasma parameters, or other parameters. Of course, other tools such as a beam-line ion implanter or plasma doping ion implanter may be used for various deposition or doping steps. Other deposition tools also may be used in an alternate embodiment.

The κ may be tuned by modulating pore size and pore density of the porous thin film. Modulation of pore size and porosity will change the phonon scattering on the wall or in the bulk of the porous thin film. Plasma sheath engineering may be used to control pore size and porosity because both pore size and porosity vary with the dimensions of the sheath aperture. For example, the porous Si deposition depends mainly on the ion angles, which can be adjusted by the sheath aperture size. As the sheath aperture width (G in FIG. 6) increases, the pore size may decrease and porosity may increase. Thus, since ion angles depend on the sheath aperture, the pore size and porosity can be adjusted by selecting different ion angles using plasma sheath engineering. The porosity level formed may be configured to balance high α and low κ. A porosity level that is too high may reduce α below desired levels in some embodiments.

To further control ion angles during plasma sheath engineering, the spacing between the sheath panels and the workpiece (Z in FIG. 6), chamber pressure, gas flux, and RF power may be adjusted. Pore size and porosity also can be further tuned by using different gases mixed with $SiH_4$. For example, He diluted $SiH_4$ results in larger pore sizes than $H_2$ diluted $SiH_4$. This may be caused by the difference is size between the atoms or molecules of the gas. Ne, other noble gases, other inert gases, or other gases also may affect the pore size compared to $H_2$.

Figure 5:
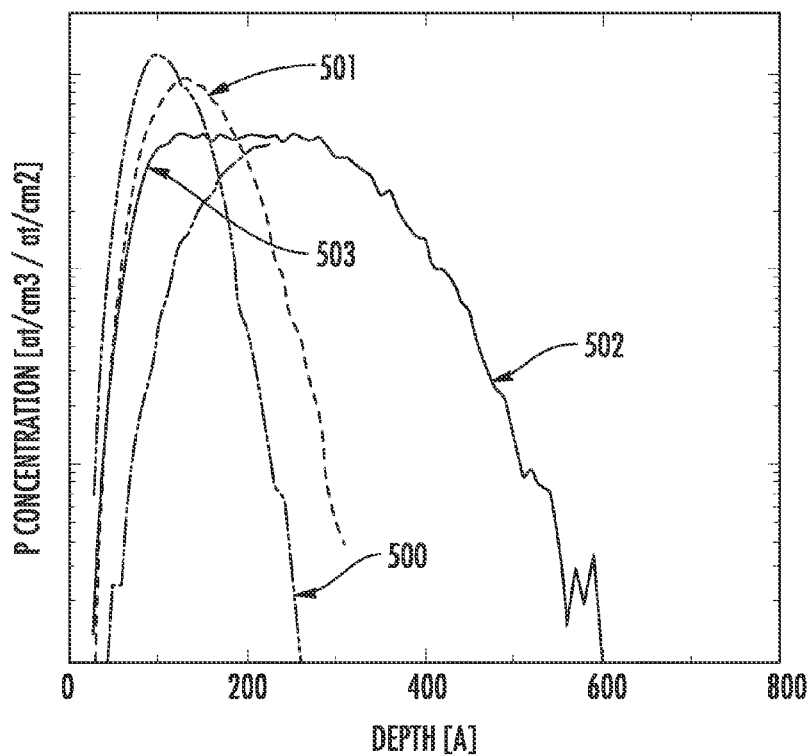
FIG. 5 is an example dopant dose profile in porous Si using three different implants.

In addition to reducing the thermal conductivity of the material, it may be important to increase the electrical conductivity (α) of that material. α can be controlled by in-situ doping, sequential doping of the porous thin films or a combination of these techniques. The dopant species and dose both will affect α. In-situ doping simultaneously provides dopants into the porous thin films during deposition. For example, $PH_3$ or $B_2H_6$ may be mixed with the process gases in the plasma chamber during deposition. Of course, any dopant, such as molecules or compounds comprising Group III or Group V elements, may be used. This causes the porous material, such as silicon, and the desired dopants to be deposited simultaneously. In other embodiments, ion implantation may be performed on an existing porous thin film in a subsequent process step. The doping level and dopant distribution can be precisely controlled using ion implantation. Multiple ion implantation steps with specific implant energies and doses may be performed to obtain a uniform dopant distribution. FIG. 5 is an example dopant dose profile in porous Si using three different implants, represented by lines 500, 501 and 502. The resulting dopant profile after the three implants 500, 501, 502 are performed is represented by line 503. Note that at greater depths (i.e. >300 A), the profile of the implant 502 and the resulting dopant profile 503 are nearly identical. A combination of in-situ doping and subsequent ion implantation may be used. Higher levels of activated dopants than is possible using only in-situ doping may be needed to obtain some high α values. Thus, a subsequent ion implantation step may be used to add more dopants and to precisely tune the doping level of a doped porous thin film. Heavily-doped porous silicon results in better α for thermoelectric devices, so the doping parameters may be configured to obtain this α. Creating polycrystalline porous thin films with high doping levels between the grains and surrounding the pores may improve α while maintaining low κ. For example, a high B diffusion and activation has been observed in the grain boundary area of a dual poly-gate (DPG) process.

In another embodiment, other conductive materials, such as carbon and metals, such as aluminum, may be co-deposited with the silicon when forming the porous films. These materials serve to increase the electrical conductivity, much like dopants.

In other embodiments, other porous materials may be used. For example, a known thermoelectric material, such as $Bi_2Te_3$, may be made porous. In accordance with one method, ions, such as hydrogen ions, are implanted in bulk $Bi_2Te_3$ to create pores. In accordance with another method, ions of Bi and Te are implanted into a porous silicon film to form porous $Bi_2Te_3$. This material may then be subjected to an anneal process. These techniques can be applied to any known thermoelectric material, including but not limited to $Bi_2Te_3$, PbTe, $CoSb_3$, SiGe, $La_3Te_4$, $Sb_2Te_3$, PbTeSe, $Yb_{14}MnSb_{12}$, TAGS and $CeFe_4Sb_{12}$.

The introduction of dopants into a porous material often requires a high temperature anneal to activate the dopants. Therefore, thermal annealing of the porous thin films also may be configured to optimize the porous thin films for thermoelectric applications. The thermal annealing activates the dopants and may crystallize the amorphous silicon, although in some embodiments, the silicon remains porous. A rapid thermal annealing (RTA) process may be used. If the ion-assisted deposition of the porous thin films is performed at relatively low temperatures, then the thin films may be amorphous. To optimize α, the porous thin film may be converted to crystalline or polycrystalline films by high temperature thermal annealing.

The creation of thermoelectric materials requires a balance between increased electrical conductivity and reduced thermal conductivity. For example, prolonged annealing may increase electrical conductivity, but simultaneously may increase thermal conductivity. Thus, in one embodiment, it may be desirable to activate the dopant while minimizing the annealing effect on the porous morphology. For example, crystalline structures may have an adverse effect on thermal conductivity. Therefore, the anneal process may be an important factor in determining the final zT.

In one embodiment, the deposition is performed at room temperature. The film is then annealed at between 900°-1000° C. for 10 minutes to activate the dopant. In a further embodiment, subsequent ion implants are also performed at room temperature prior to the anneal.

In another embodiment, the deposition is performed at an elevated temperature, such as between 400°-600° C. In this embodiment, a separate anneal may not be required. In a further embodiment, subsequent ion implants are also performed at an elevated temperature.

Other anneal techniques may also be employed. For example, rapid thermal anneal (RTA) may be performed, where the duration is in the range of several seconds. In another embodiment, a laser anneal having a duration of several milliseconds may be performed. In each of these scenarios, the dopant may be introduced into the porous film at room temperature.

Figure 7:
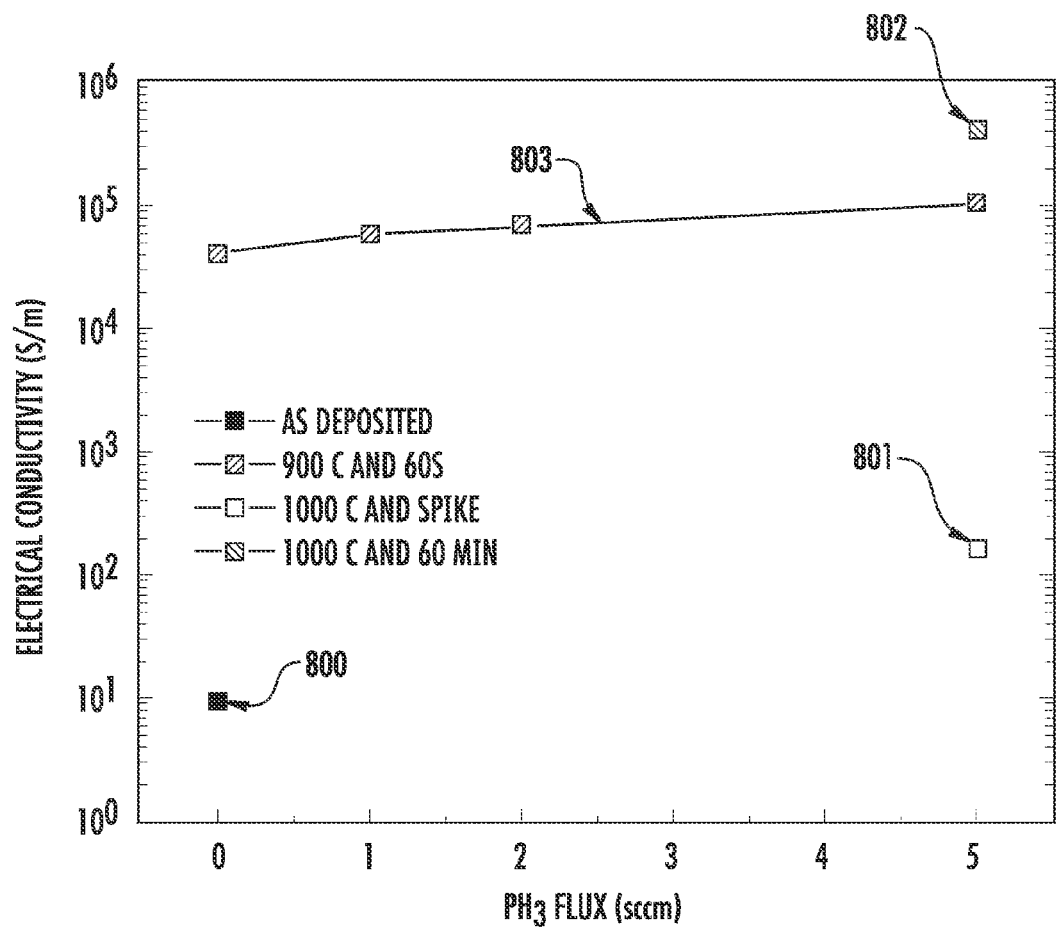
FIG. 7 is a graph showing the effects of anneal process on electrical conductivity.

FIG. 7 shows the effect of various anneal techniques on electrical conductivity. In this graph, the horizontal axis represents the dopant flow rate during the deposition process, while the vertical axis represents the electrical conductivity. As can be seen, point 800 shows the electrical conductivity of the porous film, as deposited, is about 10 S/m. This is without any dopant co-deposition.

Point 801 shows a large amount of dopant being co-deposited with the silicon. This film is then subjected to a 1000° C. spike anneal. As seen in the graph, its electrical conductivity is about 150 S/m.

Point 802 has the same flux of dopant as point 801, however, it is exposed to a 1000° C. anneal for 60 minutes which serves to increase its electrical conductivity to about 4.3 E5 S/m.

Finally, line 804 shows the effect of varying fluxes of dopant for a particular anneal process. In this example, the film was annealed at 900° C. for 60 seconds. At high flux levels, an electrical conductivity of nearly 1 E5 S/m was achieved.

Figure 8A:
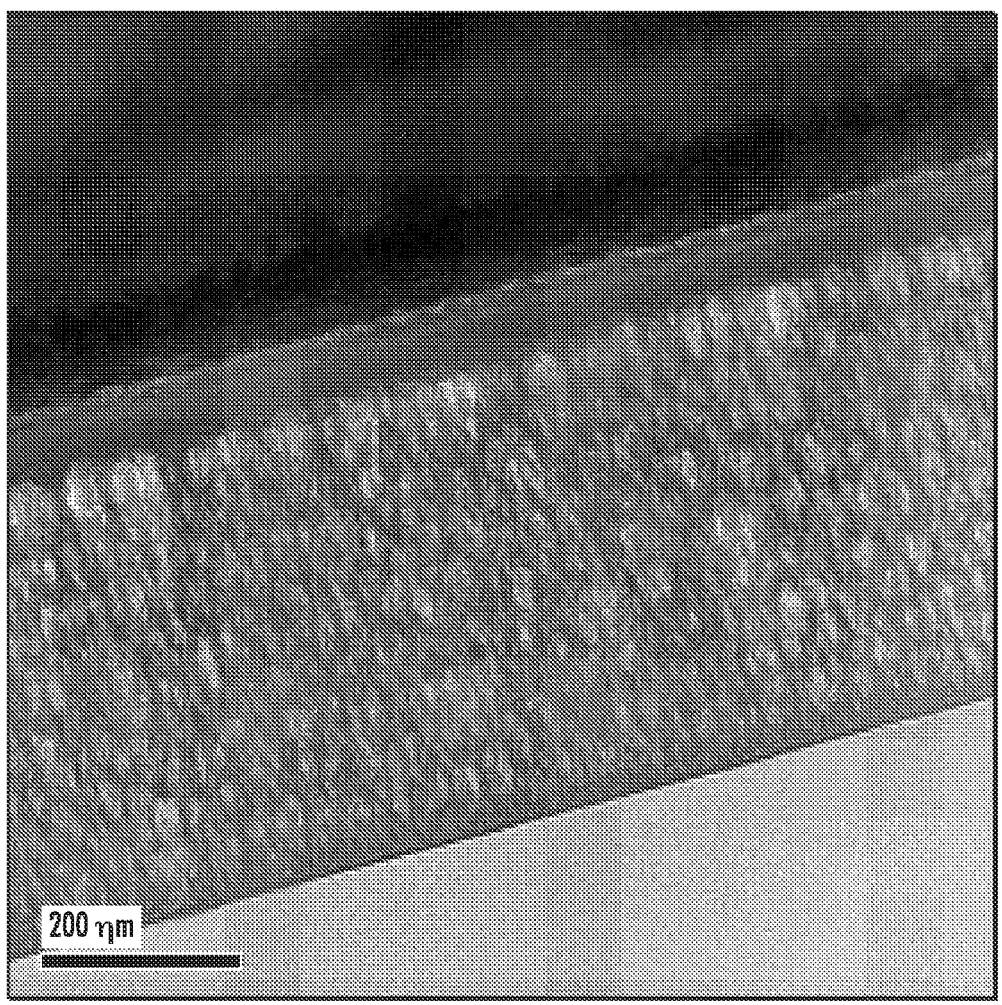
FIGS. 8A-C are cross-sections of porous films that were subjected to different anneal processes.
Figure 8B:
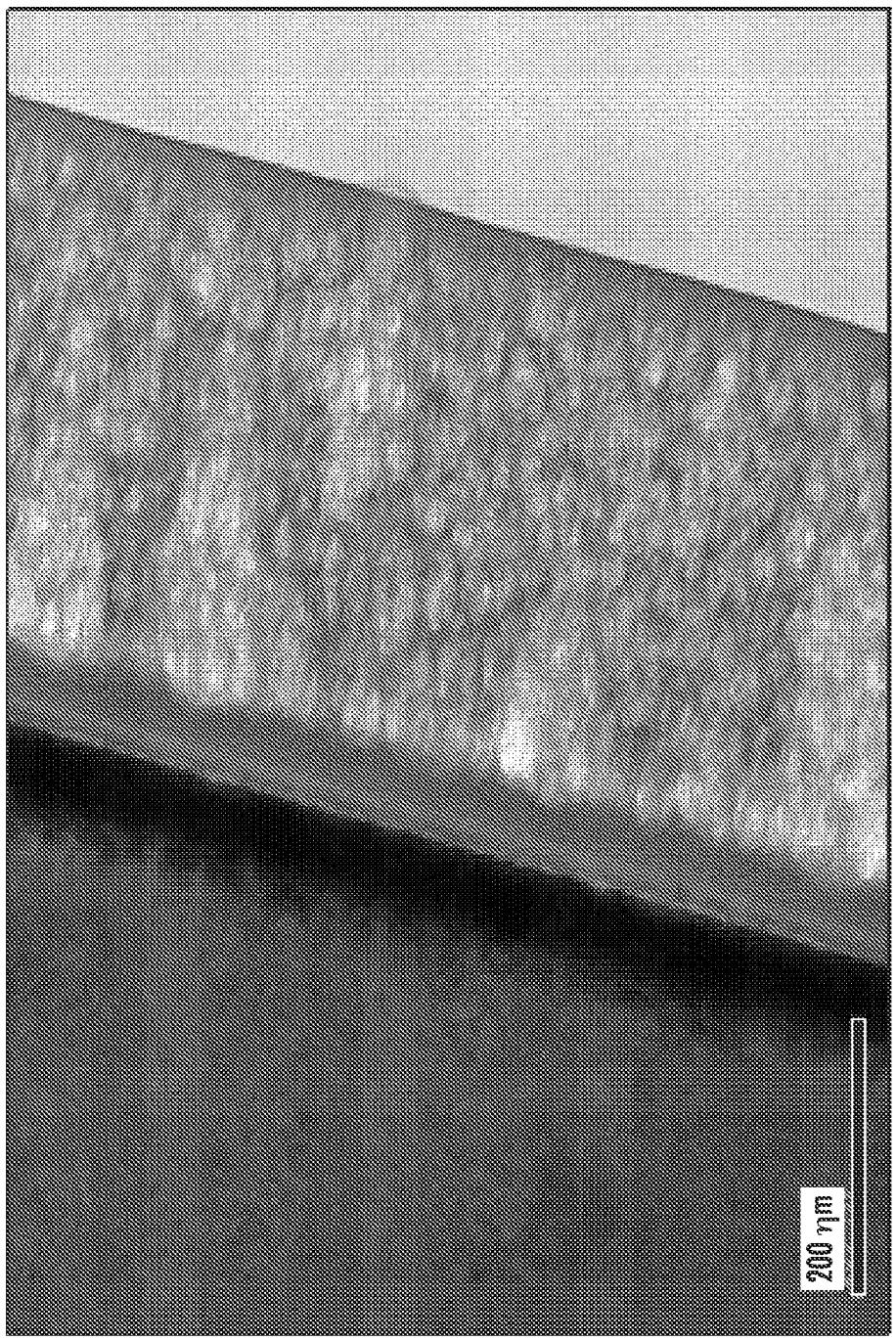
Figure 8C:
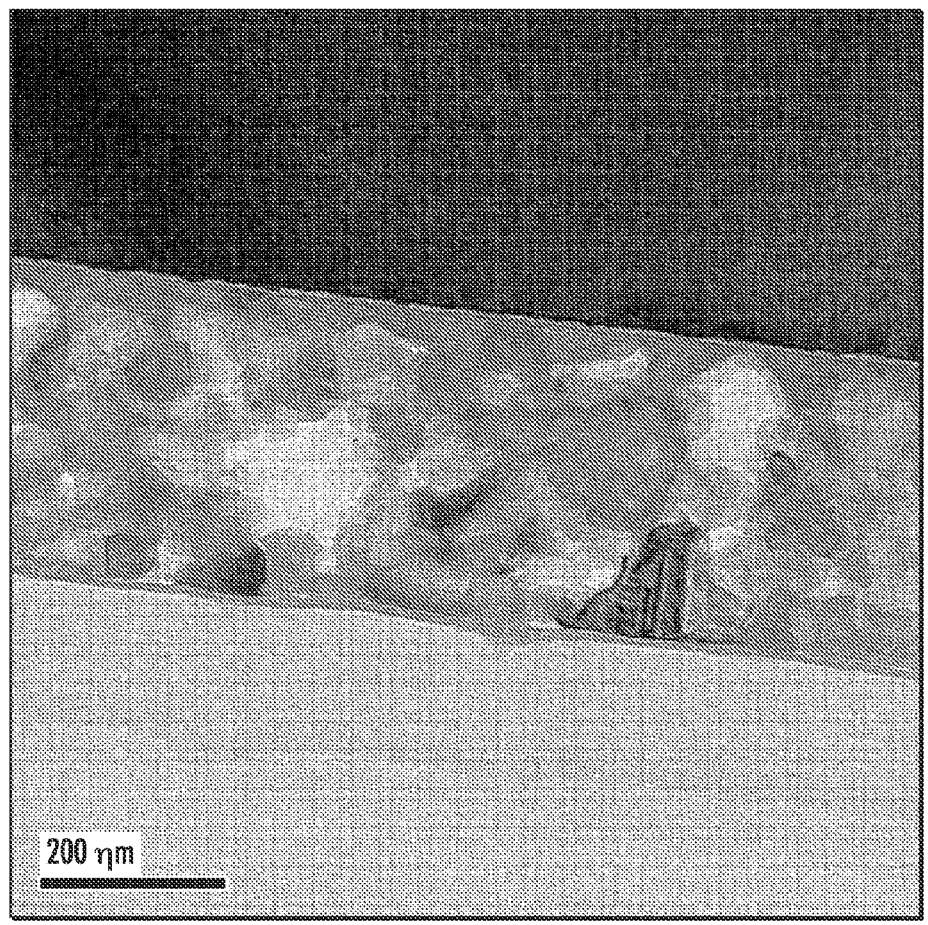

While anneal technique demonstrably affects electrical conductivity, it also has an effect of morphology. FIG. 8A-C shows the resulting cross-section of the porous layer for points 800, 801 and 802, respectively. FIG. 8A shows a porous layer having a thickness of about 425 nm, which is amorphous. FIG. 8B shows a porous layer having a thickness of about 390 nm, which is also amorphous. FIG. 8C shows a porous layer having a thickness of 340 nm, which is polycrystalline. This change to polycrystalline, caused by the prolonged anneal process, may negatively impact the thermal conductivity of the material.

Thus, while different anneal techniques may be used, in some embodiments, the anneal process is performed such that the porous layer remains amorphous. Various types of anneal processes may be performed which allow the porous film to remain amorphous. As described above, this anneal process may be performed after the co-deposition and subsequent ion implants. In other embodiments, the dopants (during co-deposition and subsequent ion implants) are introduced to the porous film at an elevated temperature. In this embodiment, a separate anneal process may not be required.

In other embodiments, some crystallization is permissible, as long that the film retains its porous properties. Porous properties include no cracks, no delamination, and small crystal grain with pores in between in one example.

In other embodiments, the anneal process is performed so as to maximize the quantity ($\alpha/\kappa$). In other words, the anneal process may be performed in such a way that the maximum electrical conductivity is not achieved, if the maximum electrical conductivity caused an unacceptable increase in thermal conductivity.

Selective or patterned deposition may be used for certain devices. For example, multiple parallel porous Si lines may be deposited on a Si workpiece. These lines may be electrically connected in series to make a high efficiency power generation device. The pattern of the sheath apertures or relative movement between the sheath apertures and the workpiece may be adjusted to form selective or patterned deposition. Thus, many different shapes or dimensions are possible for the deposited layers.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method of creating a thermoelectric material, comprising:
   depositing a porous film on a substrate;
   introducing a dopant into said porous film; and
   annealing said porous film so as to activate said dopant such that said porous film remains amorphous.

2. The method of claim 1, wherein said dopant is introduced by depositing said dopant simultaneously with said porous film.

3. The method of claim 1, wherein said dopant is introduced by ion implantation into said porous film.

4. The method of claim 1, said dopant is introduced by depositing said dopant simultaneously with said porous film and by subsequent ion implantation into said porous film.

5. The method of claim 1, wherein said annealing comprises heating said porous film at a temperature of between 900° and 1000° C. for a duration of 10 minutes.

6. The method of claim 1, wherein said annealing comprises a rapid thermal anneal.

7. The method of claim 1, wherein said annealing comprises introducing said dopant at a temperature between 400° and 600° C.

8. The method of claim 1, wherein said depositing of said porous film comprises modifying a plasma sheath.

9. A method of creating a thermoelectric material, comprising:
   depositing a porous film on a substrate, said porous film comprising silicon and a dopant;
   introducing additional amounts of said dopant into said porous film through at least one subsequent ion implantation; and
   annealing said porous film so as to activate said dopant.

10. The method of claim 9, wherein said anneal allows said porous film to remain amorphous.

11. The method of claim 9, wherein said anneal allows said porous film to retain its porous properties.

12. The method of claim 9, wherein said annealing comprises performing said depositing and introducing steps at temperatures between 400° and 600° C.

13. The method of claim 9, wherein said annealing comprises heating said porous film at a temperature of between 900° and 1000° C. for a duration of 10 minutes.

14. The method of claim 9, wherein said annealing comprises a rapid thermal anneal.

15. The method of claim 9, wherein said dopant comprises boron, phosphorus, carbon or a metal.

16. The method of claim 9, wherein said dopant comprises a plurality of materials, wherein a compound formed from said plurality of materials comprises a known thermoelectric material, wherein said known thermoelectric material is selected from the group consisting of $Bi_2Te_3$, PbTe, $CoSb_3$, SiGe, $La_3Te_4$, $Sb_2Te_3$, PbTeSe, $Yb_{14}MnSb_{11}$, TAGS and $CeFe_4Sb_{12}$.

17. The method of claim 9, wherein said depositing of said porous film comprises modifying a plasma sheath.

18. The method of claim 9, wherein said anneal process is performed so as to maximize the quantity ($\alpha/\kappa$), where $\alpha$ represents electrical conductivity of said porous film and $\kappa$ represents thermal conductivity of said porous film.

\* \* \* \* \*